(12) United States Patent
Ng et al.

(10) Patent No.: US 9,178,545 B2
(45) Date of Patent: Nov. 3, 2015

(54) DIGITAL IIR FILTER WITH ADJUSTABLE FILTER WEIGHTS BASED ON MEASURED CHANGES IN THE PROCESSED DATA

(71) Applicant: STMicroelectronics Asia Pacific Pte. Ltd., Singapore (SG)

(72) Inventors: Hon Siong Ng, Singapore (SG); Kusuma Adi Ningrat, Singapore (SG); Praveesh Chandran, Singapore (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 145 days.

(21) Appl. No.: 13/861,057

(22) Filed: Apr. 11, 2013

(65) Prior Publication Data

US 2014/0307840 A1 Oct. 16, 2014

(51) Int. Cl.
| | |
|---|---|
| H03H 7/30 | (2006.01) |
| H03H 7/40 | (2006.01) |
| H03K 5/159 | (2006.01) |
| H04B 1/10 | (2006.01) |

(52) U.S. Cl.
CPC .................... *H04B 1/1027* (2013.01)

(58) Field of Classification Search
CPC ..................................................... H04B 1/1027

USPC ......................................................... 375/232
See application file for complete search history.

(56) References Cited

U.S. PATENT DOCUMENTS

| | | | |
|---|---|---|---|
| 5,170,369 A | 12/1992 | Rossum | |
| 5,502,663 A | 3/1996 | Lyon | |
| 6,263,354 B1 | 7/2001 | Gandhi | |
| 7,483,931 B2 | 1/2009 | Shimotoyodome | |
| 2004/0120391 A1* | 6/2004 | Lin et al. ........................ | 375/219 |
| 2005/0169360 A1* | 8/2005 | Shimotoyodome ............ | 375/232 |
| 2005/0239410 A1* | 10/2005 | Rochester, III ............. | 455/67.11 |

\* cited by examiner

*Primary Examiner* — Tanmay Shah
(74) *Attorney, Agent, or Firm* — Gardere Wynne Sewell LLP

(57) ABSTRACT

A digital filter receives a sequence of input signal values. A filtering block performs a filtering operation on sequence of input signal values that is controlled by filter coefficients. A control block also receives the sequence of input signal values. The control block evaluates detected changes over time with respect to the sequence of input signal values and selects values for the filter coefficients based on the detected changes. The detected change over time provides an indication of the whether the sequence of input signal values is changing signal state. If so, the filter coefficients are selected to emphasize signal response time over signal noise filtering for the filtering operation. Otherwise, the filter coefficients are selected to emphasize signal noise filtering over signal response time for the filtering operation.

31 Claims, 3 Drawing Sheets

US 9,178,545 B2

DIGITAL IIR FILTER WITH ADJUSTABLE FILTER WEIGHTS BASED ON MEASURED CHANGES IN THE PROCESSED DATA

TECHNICAL FIELD

The present invention relates to a digital infinite impulse response (IIR) filter and, in particular, to a digital IIR filter whose filter coefficients are adjusted in response to a detected change in the data being filtered.

BACKGROUND

Reference is now made to FIG. 1 which illustrates an implementation architecture for a first order digital infinite impulse response (IIR) filter 10. The sequence X of (input) signal values received at input 12 of filter 10 is processed by multipliers, adders and delays to produce a sequence Y of (output) signal values at output 14. A first multiplier 16 has an input coupled to receive the sequence X of signal values received at input 12 and an output which produces a weighted sequence X of signal values formed by multiplying the sequence X of signal values received at input 12 by a first coefficient (weight or gain parameter) $W_0$. An adder 18 combines a feed forward path from the output of the first multiplier 16 with a feedback path. An output of the adder 18 produces the sequence Y of signal values at the output 14. The feedback path is formed by a delay block 20 coupled in series with a second multiplier 22. The delay block 20 has an input coupled to receive the sequence Y of signal values and output a delayed sequence Y of signal values. The second multiplier 22 has an input coupled to receive the delayed sequence Y of signal values and an output which produces a weighted delayed sequence Y of signal values formed by multiplying the delayed sequence Y of signal values at output 14 by a second coefficient (weight or gain parameter) $W_1$. The adder 18 sums the weighted sequence X of signal values (output from the first multiplier 16 in the feed forward path) with the weighted delayed sequence Y of signal values (output from the second multiplier 22 in the feedback path) to produce the sequence Y of signal values at output 14.

The time-domain expression for the filter 10 representing the output in terms of the input is given by the following:

$$Y_n = X_n * W_0 + Y_{n-1} * W_1$$

Where: the subscript n denotes a time index for the sequence of signal values.

The first and second coefficients $W_0$ and $W_1$ have fixed values satisfying the following relationship:

$$W_0 + W_1 = \text{a constant, for example equal to 1}$$

Those skilled in the art understand that the response of the filter 10 is very dependent on the values of the first and second coefficients $W_0$ and $W_1$. For example, with a relatively larger first coefficient $W_0$ and a relatively smaller second coefficient $W_1$, i.e., $W_0 > W_1$, the filter has a fast signal response time but a poor signal noise filtering characteristic (see, FIG. 2A which illustrates very little filtering of the noise in sequence X has been accomplished in the sequence Y but the filter does exhibit a fast response time at the data state change 100). Conversely, with a relatively larger second coefficient $W_1$ and a relatively smaller first coefficient $W_0$, i.e., $W_1 > W_0$, the filter has a slow signal response time but a good signal noise filtering characteristic (see, FIG. 2B which illustrates significant filtering of the noise in sequence X has been accomplished in the sequence Y at expense of a poor response time at the data state change 100). Because the filter weights through the first and second coefficients are fixed in filter 10, the designer must choose and be satisfied with a certain filter performance relationship between response time and filtering characteristic. This may lead to a compromised or sub-optimal filter design and operation.

Additionally, it is noted that the filter 10 configuration lacks the ability to enhance signal strength.

There accordingly exists a need in the art address the foregoing problems.

SUMMARY

In an embodiment, a digital filter comprises: a filtering block configured to receive a sequence of input signal values and perform a filtering operation on the received sequence of input signal values, said filtering operation controlled by a plurality of filter coefficients; and a control block configured to receive the sequence of input signal values, determine a change over time with respect to the sequence of input signal values and select values for the plurality of filter coefficients of the filtering block based on the determined change.

In an embodiment, a method comprises: filtering a sequence of input signal values to produce a sequence of output signal values, wherein the filtering is controlled by a plurality of filter coefficients; determining a change over time with respect to the sequence of input signal values; and selecting values for the plurality of filter coefficients based on the determined change over time.

The determination of a change over time provides an indication of the whether the sequence of input signal values is changing signal state. If so, the plurality of filter coefficients are selected to emphasize signal response time over signal noise filtering when filtering the sequence of input signal values. Otherwise, the plurality of filter coefficients are selected to emphasize signal noise filtering over signal response time.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 3:
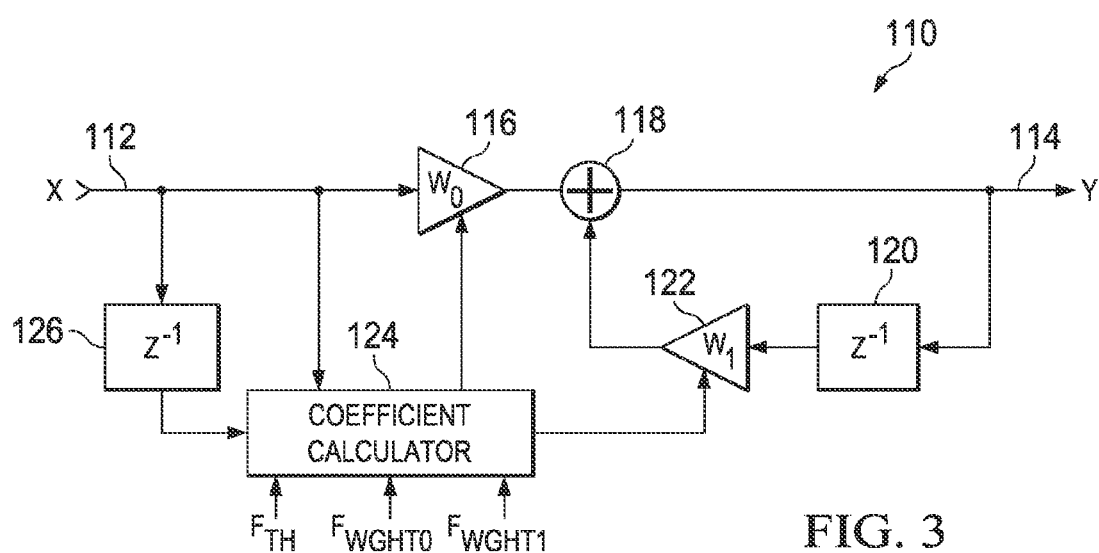
FIG. 3 illustrates an implementation architecture for a first order digital infinite impulse response (IIR) filter.

Reference is now made to FIG. 3 which illustrates an implementation architecture for a first order digital infinite impulse response (IIR) filter 110. The sequence X of (input) signal values received at input 112 of filter 110 is processed by multipliers, adders and delays to produce a sequence Y of (output) signal values at output 114. A first multiplier 116 has an input coupled to receive the sequence X of signal values received at input 112 and an output which produces a weighted sequence X of signal values formed by multiplying the sequence X of signal values received at input 112 by a first coefficient (weight or gain parameter) $W_0$. An adder 118 combines a feed forward path from the output of the first multiplier 116 with a feedback path. An output of the adder 118 produces the sequence Y of signal values at the output 114. The feedback path is formed by a first delay block 120 coupled in series with a second multiplier 122. The first delay block 120 has an input coupled to receive the sequence Y of signal values and output a delayed sequence Y of signal values. The second multiplier 122 has an input coupled to receive the delayed sequence Y of signal values and an output which produces a weighted delayed sequence Y of signal values formed by multiplying the delayed sequence Y of signal values at output 114 by a second coefficient (weight or gain parameter) $W_1$. The adder 118 sums the weighted sequence X of signal values (output from the first multiplier 116 in the feed forward path) with the weighted delayed sequence Y of signal values (output from the second multiplier 122 in the feedback path) to produce the sequence Y of signal values at output 114. The first multiplier 116, adder 118, first delay block 120 and second multiplier 122 form a filtering block for the filter 110.

The time-domain expression for the filter 110 representing the output in terms of the input is given by the following:

$$Y_n = X_n * W_0 + Y_{n-1} * W_1$$

Where: the subscript n denotes a time index for the sequence of signal values.

Figure 1:
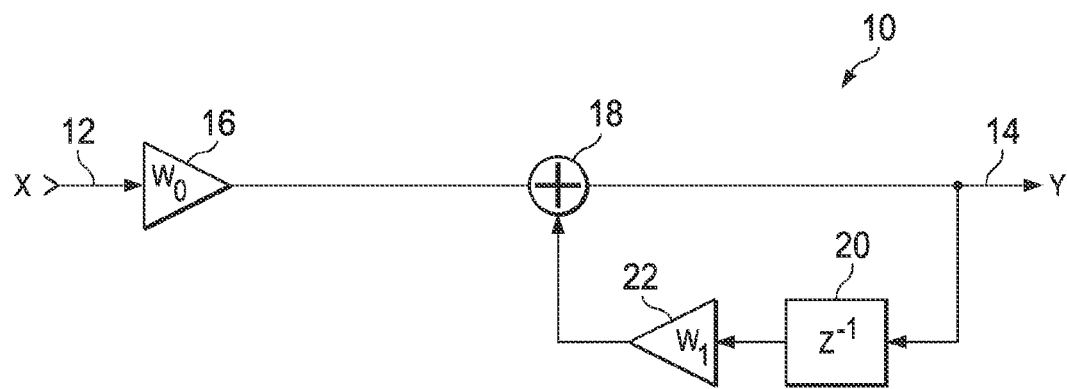
FIG. 1 illustrates an implementation architecture for a prior art first order digital infinite impulse response (IIR) filter.
Figure 2A:
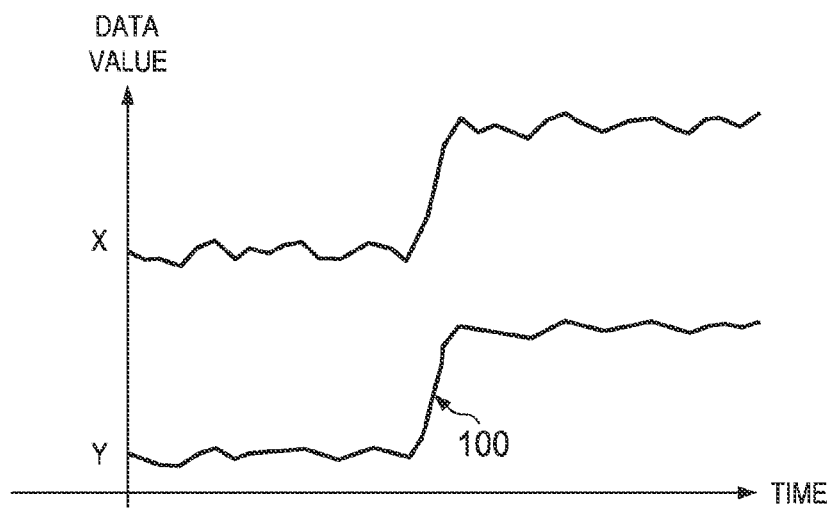
FIGS. 2A and 2B illustrate varying response of the filter of FIG. 1 with the application of different filtering weights.
Figure 2B:
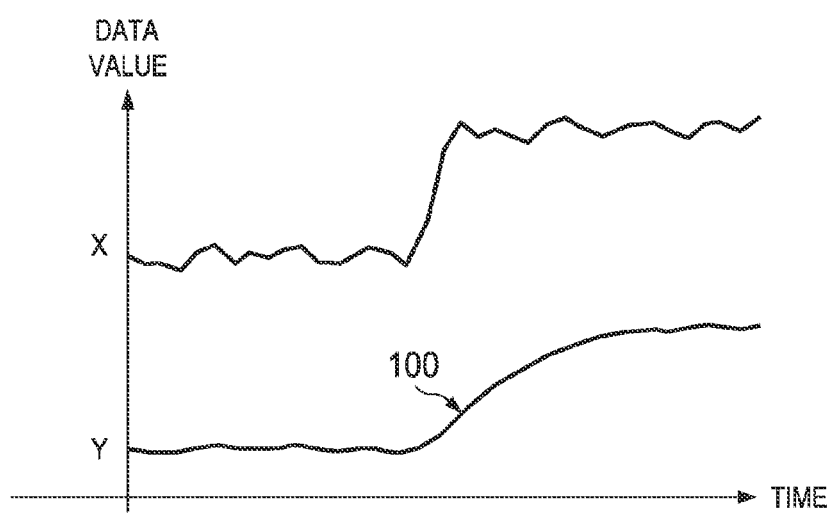

Unlike the fixed weights for the filter 10 of FIG. 1, however, the filter 110 of FIG. 2 utilizes adjustable first and second coefficients $W_0$ and $W_1$. A coefficient calculator block 124 calculates and applies the values for the first and second coefficients $W_0$ and $W_1$. The coefficient calculator block 124 receives the sequence X of signal values received at input 112. The coefficient calculator block 124 further receives a delayed sequence X of signal values output from a second delay block 126. The second delay block 126 and coefficient calculator block 124 form a control block for the filter 110. The coefficient calculator block 124 compares the sequence X of signal values to the delayed sequence X of signal values in selecting the first and second coefficients $W_0$ and $W_1$. More specifically, the coefficient calculator block 124 determines an absolute difference (Diff) between a current (n) signal value in the sequence X and an immediately preceding (n−1) signal value in the sequence X. This may be mathematically represented by the following:

$$\text{Diff} = abs(X_n - X_{n-1})$$

Again, the subscript n denotes a time index for the sequence of signal values.

The calculated value for Diff is then compared to a threshold value Fth which is representative of the floor threshold for the filter 110. If the calculated value for Diff is less than the floor threshold (i.e., Diff<Fth), the second coefficient $W_1$ is set equal to a first floor weight value $W_1$=Fwght0. Otherwise (i.e., Diff≥Fth), the second coefficient $W_1$ is set equal to a second floor weight value $W_1$=Fwght1. The second floor weight value is greater than the first floor weight value (i.e., Fwght1>Fwght0).

At any given point in time, the first and second coefficients $W_0$ and $W_1$ have values satisfying the following relationship:

$$W_0 + W_1 = \text{a constant, for example, equal to 1}$$

Thus, having determined the value for the second coefficient $W_1$, based on the comparison of the absolute difference (Diff) to the floor threshold Fth, the coefficient calculator block 124 can also calculate value for the first coefficient $W_0$ based on the fixed mathematical relationship between $W_0$ and $W_1$, which does not change regardless of selected values for the filter coefficients.

The values for the threshold value (Fth), first floor weight value (Fwght0) and second floor weight value (Fwght1) may be pre-programmed into the coefficient calculator block 124. Alternatively, the values for the threshold value (Fth), first floor weight value (Fwght0) and second floor weight value (Fwght1) may be received as input configuration values for the filter 110.

If the calculated value for Diff is less than the threshold value Fth, the coefficient calculator block 124 applies a set of weights for the first and second coefficients $W_0$ and $W_1$ wherein the second coefficient $W_1$ is relatively smaller and the first coefficient $W_0$ is relatively larger (i.e., $W_1$=Fwght0 and in an exemplary implementation $W_0$<$W_1$). In this configuration, the filter 110 will emphasize a good signal filtering characteristic over fast signal response time. This is not of concern because the determination that Diff is less than Fth indicates that the sequence X is not changing signal state and thus signal noise filtering can be emphasized over signal response time.

If the calculated value for Diff is greater than or equal to the threshold value Fth, the coefficient calculator block 124 applies a set of weights for the first and second coefficients $W_0$ and $W_1$ wherein the second coefficient $W_1$ is relatively larger and the first coefficient $W_0$ is relatively smaller (i.e., $W_1$=Fwght1 and in an exemplary implementation $W_0$>$W_1$). In this configuration, the filter 110 will emphasize signal response time over a good signal filtering characteristic. This is not of concern because the determination that Diff is greater than or equal to Fth indicates that the sequence X is changing signal state and thus signal response time needs to be emphasized over signal noise filtering.

Figure 4:
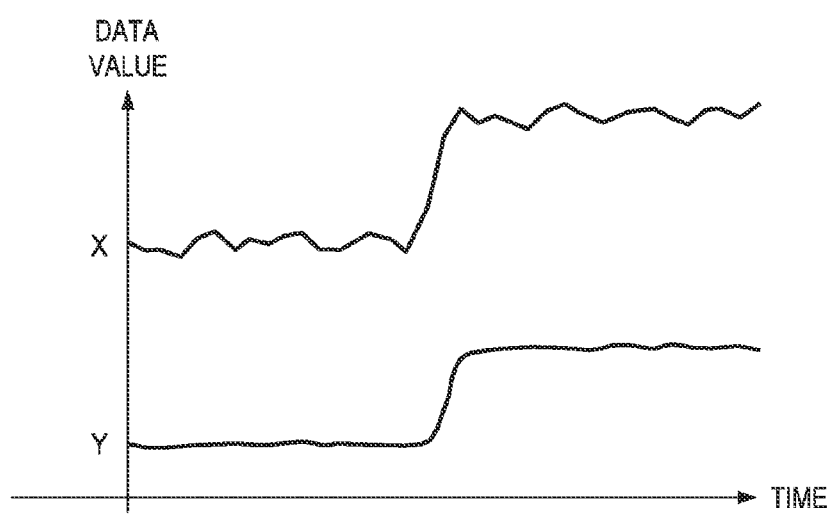
FIG. 4 illustrates the response of the filter of FIG. 3 with the adjustment of filtering weights based on data change.

The filter 110 is accordingly configurable based on measured change in the values of the input sequence X. When the comparison performed by the coefficient calculator block 124 of the current (n) signal value to the immediately preceding (n−1) signal value in the sequence X indicates significant change (such as at a signal state change), the filter coefficients are selected to emphasize signal response time over signal noise filtering (see, FIG. 4 which illustrates a fast response time at the data state change 100 due to selection of $W_1$=Fwght1). Conversely, when the comparison performed by the coefficient calculator block 124 of the current (n) signal value to the immediately preceding (n−1) signal value in the sequence X indicates insignificant change (such as at steady signal state away from the state change), the filter coefficients are selected to emphasize signal noise filtering over signal response time (see, FIG. 4 which illustrates significant filtering of the noise in sequence X away from the data state change 100 due to selection of $W_1$=Fwght0).

The filter 110 may be implemented in software using a general purpose computer, such as a personal computer, or may be implemented in hardware using a digital signal processor (DSP). The filter specification provides an algorithmic representation of filtering operation which can be implemented using control units, arithmetic units, storage registers, multipliers, adders and other structure, in either the computer or DSP environment, for receiving the inputs, manipulating the data and producing the desired outputs. The DSP may comprise a host-type DSP which is of a general purpose configuration or an application specific integrated circuit (ASIC) type which is specifically designed for the desired filter application.

Figure 5:
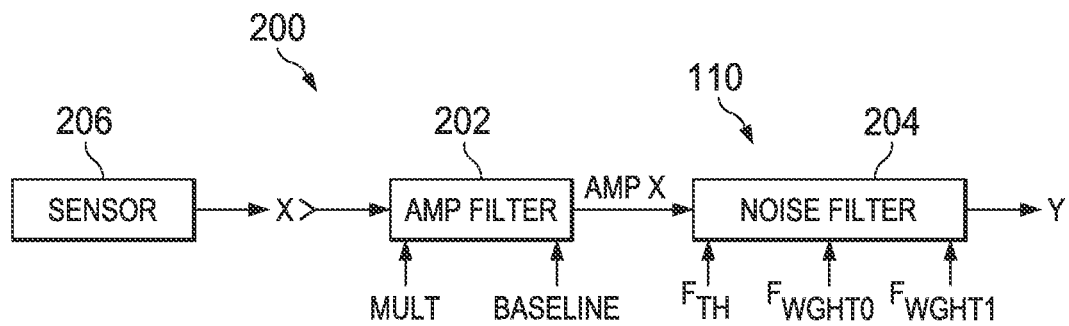
FIG. 5 is a block diagram of a cascaded filter.

Reference is now made to FIG. 5 which illustrates a block diagram of a cascaded filter 200. The filter 200 receives a sequence X of (input) signal values and outputs a sequence Y of (output) signal values. The filter 200 includes an amplifying filter 202 configured to receive the sequence X of signal values and output an amplified sequence X of signal values (amp X). The filter 200 further includes a noise filter 204 configured to receive the amplified sequence X of signal values and output the sequence Y of signal values. The noise filter 204 comprises the filter 110 of FIG. 3.

Figure 6:
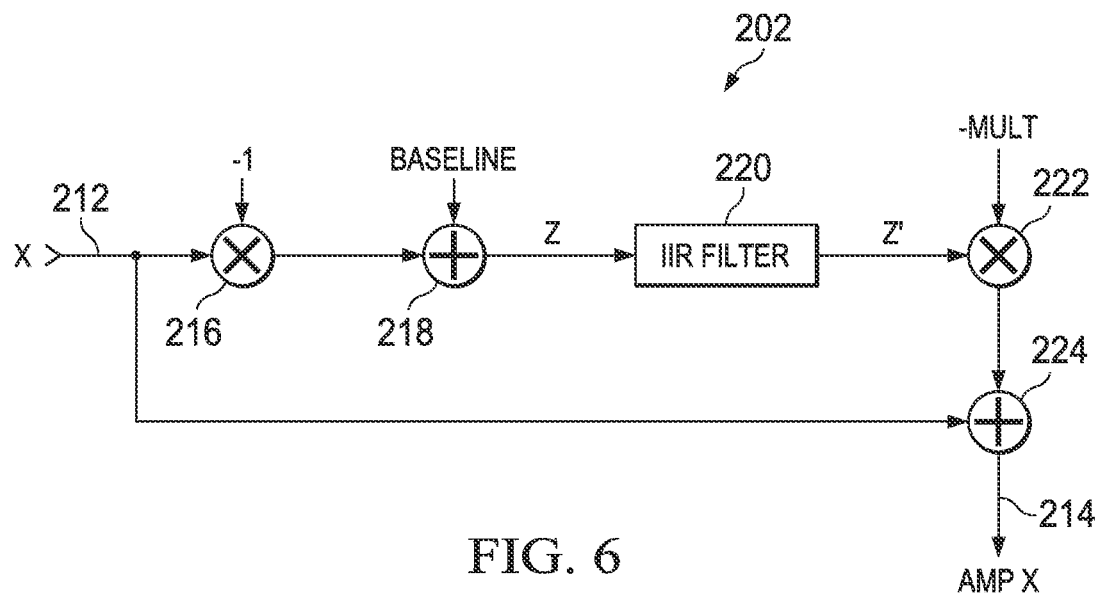
FIG. 6 illustrates an implementation architecture for a digital signal amplifying filter used within the cascaded filter of FIG. 5.

Reference is now made to FIG. 6 which illustrates an implementation architecture for the digital signal amplifying filter 202 used within the cascaded filter 200 of FIG. 5. The sequence X of signal values received at input 212 of signal amplifying filter 202 is processed by multipliers, adders and a filter to produce the amplified sequence X of signal values at output 214. A first multiplier 216 has an input coupled to receive the sequence X of signal values received at input 212 and an output which produces a negated sequence X of signal values (as a result of the unity negating (−1) second input of the first multiplier 216). A first adder 218 combines the negated sequence X of signal values with a baseline value to produce a sequence Z of signal values indicative of the strength of the sequence X of signal values. The baseline value is a calibrated value of the source system which generates the sequence X of signal values. For example, if the source system is a capacitive touch sensor (see reference 206 of FIG. 5), the baseline value would be the value output from the capacitive touch sensor in the absence of a touch. A digital infinite impulse response (IIR) filter 220 has an input configured to receive the sequence Z of signal values and an output configured to output a filtered sequence Z' of signal values. The filter 220 may comprise any suitable filter including the filter 10 of FIG. 1. A second multiplier 222 has an input coupled to receive the filtered sequence Z' of signal values and an output which produces a negated and amplified filtered sequence Z' of signal values (as a result of the negating second input of the second multiplier 222). The amplification factor is set by the value of the input mult. A second adder 224 combines the negated and amplified filtered sequence Z' of signal values with the sequence X of signal values received at input 212 to produce the amplified sequence X of signal values (amp X) at output 214.

The digital signal amplifying filter 202 essentially functions to amplify the sequence X of signal values without significantly amplifying included signal noise. The noise filter 204 essentially functions to reduce the included signal noise without adversely affecting signal response time.

The filter 200 may be implemented in software using a general purpose computer, such as a personal computer, or may be implemented in hardware using a digital signal processor (DSP). The filter specification provides an algorithmic representation of filtering operation which can be implemented using control units, arithmetic units, storage registers, multipliers, adders and other structure, in either the computer or DSP environment, for receiving the inputs, manipulating the data and producing the desired outputs. The DSP may comprise a host-type DSP which is of a general purpose configuration or an application specific integrated circuit (ASIC) type which is specifically designed for the desired filter application. The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A digital filter, comprising:
   a filtering block configured to receive a sequence of input signal values, perform a filtering operation and generate a sequence of output signal values, said filtering operation controlled by first and second filter coefficients; and
   a control block configured to receive the sequence of input signal values, determine a change in input signal magnitude over time with respect to the sequence of input signal values by determining a difference between consecutive input signal values in said sequence in comparison to a threshold value and select the first and second filter coefficients based on said comparison;
   wherein said filtering block includes:
      a first multiplier operating to multiply the sequence of input signal values by the first filter coefficient;
      a second multiplier operating to multiply a delayed sequence of output signal values by the second filter coefficient; and
      an adder configured to sum outputs of the first and second multipliers to generate said sequence of output signal values.

2. The digital filter of claim 1, wherein the control block is operable to select values for the first and second filter coefficients which emphasize signal response time over signal noise filtering by the filtering operation if the determined change in input signal magnitude over time exceeds said threshold value.

3. The digital filter of claim 1, wherein the control block is operable to select values for the first and second filter coefficients which emphasize signal noise filtering over signal response time by the filtering operation if the determined change in input signal magnitude over time is less than said threshold value.

4. The digital filter of claim 1, wherein the control block is operable to select values for the first and second filter coefficients which emphasize signal response time over signal noise filtering by the filtering operation if the determined change in input signal magnitude over time is indicative of a change in state for the sequence of input signal values.

5. The digital filter of claim 1, wherein the control block is operable to select values for the first and second filter coefficients which emphasize signal noise filtering over signal response time by the filtering operation if the determined change in input signal magnitude over time is indicative of no change in state for the sequence of input signal values.

6. The digital filter of claim 1, further comprising an amplifying block configured to receive a sequence of source signal values, subtract a baseline value from the sequence of source signal values, filter a result of the subtraction, amplify a result of the filtering, and add the amplified result to the sequence of source signal values to output the sequence of input signal values to the filtering block.

7. A digital filter, comprising:
   a filtering block configured to receive a sequence of input signal values and perform a filtering operation on the received sequence of input signal values, said filtering operation controlled by a plurality of filter coefficients;
   a control block configured to receive the sequence of input signal values, determine a change in input signal magnitude over time with respect to the sequence of input signal values and select values for the plurality of filter coefficients of the filtering block based on the determined change in input signal magnitude over time; and an amplifying block configured to receive a sequence of source signal values and output the sequence of input signal values to the filtering block, wherein the sequence of input signal values is an amplified version of the sequence of source signal values;

wherein the amplifying block is configured to: subtract a baseline value from the sequence of source signal values, filter a result of the subtraction, amplify a result of the filtering, and add the amplified result to the sequence of source signal values to produce the sequence of input signal values.

8. The digital filter of claim 7, wherein the sequence of source signal values is received from a capacitive touch sensor and the baseline is a signal value output from the capacitive touch sensor in the absence of a touch.

9. A digital filter, comprising:
a filtering block configured to receive a sequence of input signal values and perform a filtering operation on the received sequence of input signal values, said filtering operation controlled by a plurality of filter coefficients; and a control block configured to receive the sequence of input signal values, determine a change over time with respect to the sequence of input signal values and select values for the plurality of filter coefficients of the filtering block based on the determined change;

wherein the filtering block is configured to amplify the sequence of input signal values with a first filtering coefficient, delay a sequence of output signal values from the filtering block, amplify the delayed sequence of output signal values with a second filtering coefficient, and add the first filtering coefficient amplified sequence of input signal values to the second filtering coefficient amplified delayed sequence of output signal values to generate the sequence of output signal values.

10. The digital filter of claim 9, wherein a sum of the first filtering coefficient and second filtering coefficient equals a constant regardless of control block selection of filter coefficients.

11. The digital filter of claim 9, wherein the control block is operable to select a relatively lower value for the second filtering coefficient if the determined a change over time is indicative of no change in state for the sequence of input signal values and select a relatively higher value for the second filtering coefficient if the determined change over time is indicative of a change in state for the sequence of input signal values.

12. The digital filter of claim 11, wherein the relatively lower value for the second filtering coefficient emphasizes noise filtering over response time with respect to the filtering operation performed on the sequence of input signal values by the filtering block.

13. The digital filter of claim 11, wherein the relatively higher value for the second filtering coefficient emphasizes response time over noise filtering with respect to the filtering operation performed on the sequence of input signal values by the filtering block.

14. The digital filter of claim 11, wherein the relatively lower value for the second filtering coefficient is a second filtering coefficient less than the first filtering coefficient, and the relatively higher value for the second filtering coefficient is a second filtering coefficient greater than the first filtering coefficient.

15. A method, comprising:
filtering a sequence of input signal values to produce a sequence of output signal values, wherein the filtering is controlled by a plurality of filter coefficients;

determining a change in input signal magnitude over time with respect to the sequence of input signal values; and selecting values for the plurality of filter coefficients based on the determined change in input signal magnitude over time.

16. The method of claim 15, wherein determining the change in input signal magnitude comprises determining an absolute difference between a current value in the sequence of input signal values and a previous value in the sequence of input signal values in comparison to a threshold.

17. The method of claim 15, wherein determining comprises calculating a difference between the current input signal magnitude value in the sequence of input signal values and the previous input signal magnitude value in the sequence of input signal values.

18. The method of claim 17, wherein determining further comprises comparing the difference to a threshold.

19. The method of claim 18, wherein selecting comprises selecting first values for the plurality of filter coefficients which emphasize signal response time over signal noise filtering in filtering the sequence of input signal values if the difference equals or exceeds the threshold.

20. The method of claim 18, wherein selecting comprises selecting second values for the plurality of filter coefficients which emphasize signal noise filtering over signal response time in filtering the sequence of input signal values if the difference is less than the threshold.

21. The method of claim 15, wherein determining the change in input signal magnitude over time comprises determining whether changes in the sequence of input signal values over time are indicative of a change in signal state for the sequence of input signal values, and wherein selecting values for the plurality of filter coefficients comprises selecting, in response to the determined indication of change in signal state, first values for the plurality of filter coefficients which emphasize signal response time over signal noise filtering in filtering the sequence of input signal values.

22. The method of claim 15, wherein determining the change in input signal magnitude over time comprises determining whether changes in the sequence of input signal values over time are indicative of a change in signal state for the sequence of input signal values, and wherein selecting values for the plurality of filter coefficients comprises selecting, in response to no determined indication of change in signal state, second values for the plurality of filter coefficients which emphasize signal noise filtering over signal response time in filtering the sequence of input signal values.

23. The method of claim 15, further comprising amplifying the sequence of input signal values prior to filtering.

24. The method of claim 23, wherein amplifying comprises: subtracting a baseline value from a sequence of source signal values, filtering a result of the subtraction, amplifying a result of the filtering, and adding the amplified result to the sequence of source signal values to produce the sequence of input signal values.

25. The method of claim 24, wherein the sequence of source signal values is received from a capacitive touch sensor and the baseline is a signal value output from the capacitive touch sensor in the absence of a touch.

26. A method, comprising:
filtering a sequence of input signal values to produce a sequence of output signal values, wherein the filtering is controlled by a plurality of filter coefficients;

determining a change over time with respect to the sequence of input signal values; and selecting values for the plurality of filter coefficients based on the determined change over time;

wherein filtering comprises:
> amplifying the sequence of input signal values with a first filtering coefficient,
> delaying the sequence of output signal values produced by filtering,
> amplifying the delayed sequence of output signal values with a second filtering coefficient, and
> adding the first filtering coefficient amplified sequence of signal values to the second filtering coefficient amplified delayed sequence of output signal values to generate the sequence of output signal values.

27. The method of claim 26, wherein a sum of the first filtering coefficient and second filtering coefficient equals a constant regardless of selected values.

28. The method of claim 26, wherein selecting values for the plurality of filter coefficients comprises selecting the second filtering coefficient less than the first filtering coefficient if the determined change over time indicates a change in signal state for the sequence of input signal values, and selecting the second filtering coefficient greater than the first filtering coefficient if the determined change over time indicates no change in signal state for the sequence of input signal values.

29. The method of claim 26, further comprising amplifying the sequence of input signal values prior to filtering.

30. The method of claim 29, wherein amplifying comprises: subtracting a baseline value from a sequence of source signal values, filtering a result of the subtraction, amplifying a result of the filtering, and adding the amplified result to the sequence of source signal values to produce the sequence of input signal values.

31. The method of claim 30, wherein the sequence of source signal values is received from a capacitive touch sensor and the baseline is a signal value output from the capacitive touch sensor in the absence of a touch.

* * * * *